(12) United States Patent
Lee

(10) Patent No.: US 7,646,076 B2
(45) Date of Patent: Jan. 12, 2010

(54) METHOD OF FABRICATING CMOS IMAGE SENSOR

(75) Inventor: Yong Suk Lee, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 63 days.

(21) Appl. No.: 12/151,859

(22) Filed: May 9, 2008

(65) Prior Publication Data

US 2008/0277751 A1 Nov. 13, 2008

Related U.S. Application Data

(62) Division of application No. 11/301,830, filed on Dec. 12, 2005, now Pat. No. 7,388,270.

(30) Foreign Application Priority Data

Dec. 14, 2004 (KR) ............... 10-2004-0105563

(51) Int. Cl.
*H01L 31/00* (2006.01)
(52) U.S. Cl. .............. 257/440; 257/466; 257/432; 257/E31.121; 257/E31.127; 438/70; 438/71
(58) Field of Classification Search ........ 257/440, 257/466, 432, E31.121, E31.127
See application file for complete search history.

(56) References Cited

U.S. PATENT DOCUMENTS 6,379,992 B2 * 4/2002 Jo ..................... 438/70

6,821,810 B1 11/2004 Hsiao et al.
7,166,489 B2 1/2007 Kim

FOREIGN PATENT DOCUMENTS

JP 10-163464 6/1998
KR 2002-0012877 2/2002

OTHER PUBLICATIONS

Sang Sik Kim; "Method for Forming Micro Lens of Charge Coupled Device"; Published Date Feb. 20, 2002; 2 Pgs.; Korean Patent Abstracts; Publication No. 1020020012877 A; Korean Intellectual Property Office, Republic of Korea.
Masatoki Nakabayashi; "Manufacture of Solid State Image Pickup Device"; Patent Abstracts of Japan; 2 Pgs.; Publication No. 10-163464; Published Date Jun. 19, 1998.
Office Action, Korean Patent Application No. 10-2004-0105563, Dated Aug. 23, 2006; 2 Pgs.

* cited by examiner

*Primary Examiner*—Tu-Tu V Ho
(74) *Attorney, Agent, or Firm*—The Law Offices of Andrew D. Fortney; Andrew D. Fortney

(57) ABSTRACT

A method of fabricating a CMOS image sensor is provided, in which a trapezoidal microlens pattern profile is formed to facilitate reflowing the microlens pattern and by which a curvature of the microlens may be enhanced to raise its light-condensing efficiency. The method includes forming a plurality of photodiodes on a semiconductor substrate; forming an insulating interlayer on the semiconductor substrate including the photodiodes; forming a protective layer on the insulating interlayer; forming a plurality of color filters corresponding to the photodiodes; forming a top coating layer on the color filters; forming a microlens pattern on the top coating layer; and forming a plurality of microlenses by reflowing the microlens pattern.

19 Claims, 5 Drawing Sheets

METHOD OF FABRICATING CMOS IMAGE SENSOR

The present application is a divisional of application Ser. No. 11/301,830, filed Dec. 12, 2005, now U.S. Pat. No. 7,388,270. This application also claims the benefit of Korean Patent Application No. 10-2004-0105563, filed on Dec. 14, 2004, which is hereby incorporated by reference as if fully set forth herein.

BACKGROUND OF THE INVENTION

1. Field of the Invention

The present invention relates to an image sensor, and more particularly, to a method of fabricating a CMOS image sensor. Although the present invention is suitable for a wide scope of applications, it is particularly suitable for enhancing light-condensing efficiency by improving a curvature of a lens in a CMOS image sensor.

2. Discussion of the Related Art

An image sensor is a semiconductor device that converts an optical image to an electric signal. Image sensors can be classified into charge-coupled devices and complementary metal-oxide-semiconductor (CMOS) image sensor devices.

The CMOS image sensor includes a photodiode unit sensing an applied light and a CMOS logic circuit unit processing the sensed light into an electric signal as data. Photosensitivity of the image sensor is enhanced if a quantity of light received by the photodiode is raised. To enhance the photosensitivity, a fill factor (e.g., the photodiode area divided by the entire area of image sensor) may be raised, or a path of light incident on an area other than the photodiode may be diverted to condense or direct the diverted light to the photodiode.

For example, a microlens may be used in condensing the diverted light onto the photodiode. By providing a convex microlens formed from a material having good light transmittance over a photodiode, a path of an incident light may be refracted towards the photodiode. Hence, more light can be applied to the photodiode area. In doing so, a light parallel to an optical axis of the microlens can be refracted by the microlens to focus at a prescribed position on the optical axis.

Referring to FIG. 1, a CMOS image sensor according to a related art includes one or more photodiodes 11 formed on a semiconductor substrate (not shown) to generate electric charges according to a quantity of incident light received on the photodiode(s) 11, an insulating interlayer 12 formed over the substrate including the photodiodes 11, a protective and/or first planarizing layer 13 formed on the insulating interlayer 12, a R/G/B color filter layer 14 formed on the layer 13 to transmit light having a specific wavelength therethrough, a second planarizing layer 15 formed over the substrate including the color filter layer 14, and a microlens 16 formed on the second planarizing layer 15 having a convex shape with a predetermined curvature and adapted to condense the received light onto an area of the corresponding photodiode 11 through the color filter layer 14.

An optical shielding layer (not shown) may be provided within the insulating interlayer 12 to prevent the light from one filter in the color filter layer 14 from entering another photodiode area except the corresponding photodiode 11 (i.e., the photodiode directly below a given filter). The photodiode can be replaced by a photo gate to sense the light.

In this case, a curvature, height (A), and like dimensions of the microlens 16 are determined by considering various factors including a focus of the condensed light and the like. The microlens 16 is mainly formed from a polymer-based resin by deposition, patterning, reflowing and the like. Namely, the microlens 16 has a size, position and shape related to a corresponding unit pixel and a thickness of the photosensitive device thereunder, and generally has an optimal size determined according to a height, position, size and the like of the optical shielding layer, and the radius of curvature.

Meanwhile, the shape of the lens pattern profile depends on an exposure condition (e.g., focus) of the photoresist. For instance, one or more process conditions for making the microlens can be varied according to a thin film situation of a semiconductor substrate, whereby a profile of the microlens may be changed. Since the pattern forming condition can be relatively unstable, the light-condensing efficiency can be less than optimal. Thus, in the process for fabricating the related art CMOS image sensor, the microlens 16, provided to enhance a light-condensing power, is an important factor and/or structure affecting characteristics of the image sensor. A microlens having increased light-condensing efficiency transmits more light to the photodiode 11 through the corresponding color filter layer 14 (which selects a color for detection by photodiode according to the wavelength of light that passes through it). That is, the light incident on the image sensor is condensed by the microlens 16 and filtered by the color filter layer 14, and then it enters the photodiode 11 under the color filter layer 14. In doing so, the optical shielding layer (not shown) plays a role in preventing the incident light from deviating to another light path and entering a different photodiode (usually for a different color, and always corresponding to a different location in the CMOS image sensor array).

FIG. 2 shows a color filter layer on a protective and/or planarizing layer in a CMOS image sensor according to a related art. Here, a plurality of rectangular color filter layers 14 are arranged on the protective and/or planarizing layer 13, uniformly spaced apart from each other.

However, the convex microlens in the related art CMOS image sensor has the following problems.

First of all, in the case of hemispherical microlenses, the light parallel to the optical axis is refracted by the lens and then arrives at the photosensitive device, which is located at a position opposing the lens, to operate the device normally. Yet, light that is not parallel to the optical axis may be refracted by the lens and arrive at another photosensitive device that is not supposed to receive the light. Hence, the device may operate abnormally.

Secondly, since a quantity of light arriving at the photosensitive device varies according to the species and thickness of the layer under the microlens, the light-condensing efficiency may be reduced and degrade the quality of the image.

SUMMARY OF THE INVENTION

Accordingly, the present invention is directed to a method of fabricating a CMOS image sensor that substantially obviates one or more problems due to limitations and disadvantages of the related art.

An object of the present invention is to provide a method of fabricating a CMOS image sensor, in which a trapezoid microlens pattern profile is formed to facilitate a reflow of a microlens and by which a curvature of the microlens may be enhanced to raise the light-condensing efficiency of the microlens.

Additional advantages, objects, and features of the invention will be set forth in part in the description which follows and in part will become apparent to those skilled in the art upon examination of the following or may be learned from practice of the invention. The objectives and other advantages of the invention may be realized and attained by the structure (s) and/or process(es) particularly pointed out in the written description and claims hereof as well as the appended drawings.

To achieve these objects and other advantages in accordance with the purpose of the invention, as embodied and broadly described herein, there is provided a method of fabricating a CMOS image sensor, the method comprising forming a plurality of photodiodes on a semiconductor substrate; forming an insulating interlayer on the semiconductor substrate including the photodiodes; forming a protective layer on the insulating interlayer; forming a plurality of color filters corresponding to the plurality of photodiodes; forming a top coating layer on the plurality of color filters; forming a microlens pattern on the top coating layer corresponding to the color filters; and forming a plurality of microlenses by reflowing the microlens pattern.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle(s) of the invention. In the drawings.

DETAILED DESCRIPTION OF THE INVENTION

Reference will now be made in detail to the preferred embodiments of the present invention, examples of which are illustrated in the accompanying drawings. Wherever possible, like reference designations will be used throughout the drawings to refer to the same or similar parts.

Figure 1:
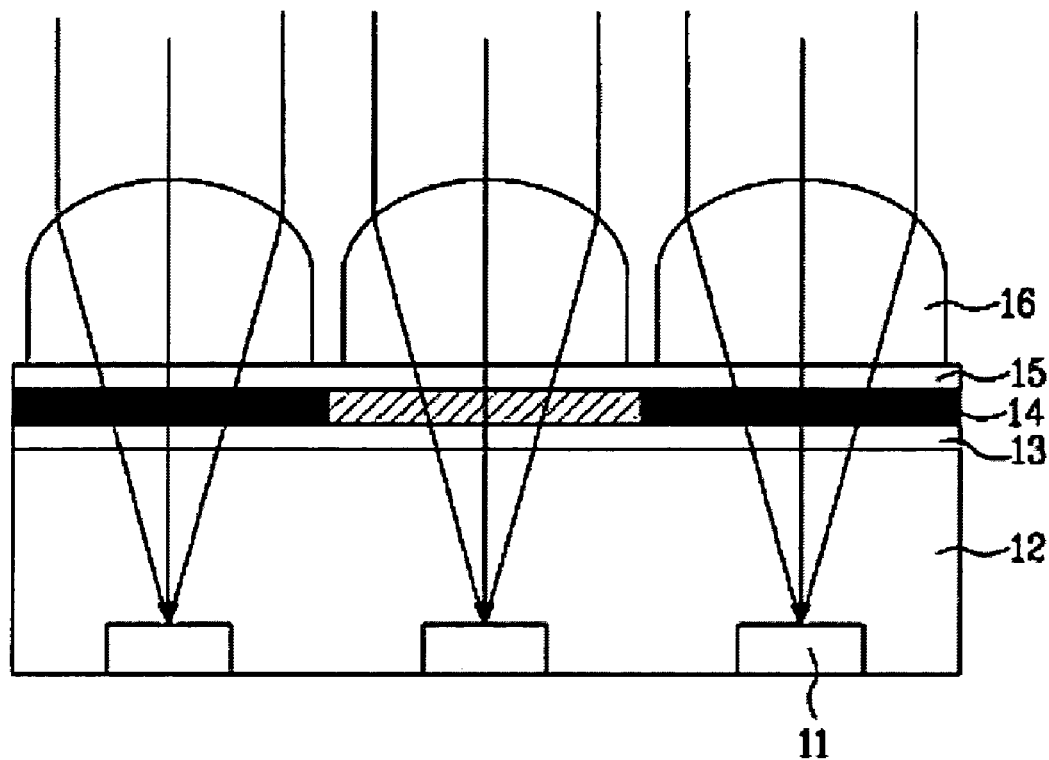
FIG. 1 is a cross-sectional diagram of a CMOS image sensor according to a related art, in which a microlens is shown.
Figure 2:
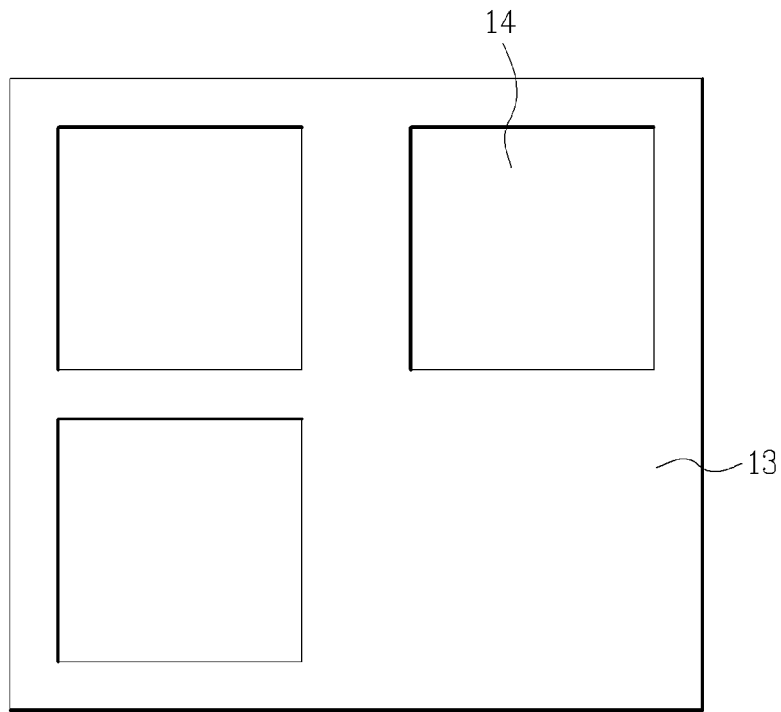
FIG. 2 is a layout of a color filter layer on a protective and/or planarizing layer in a CMOS image sensor according to a related art.
Figure 3:
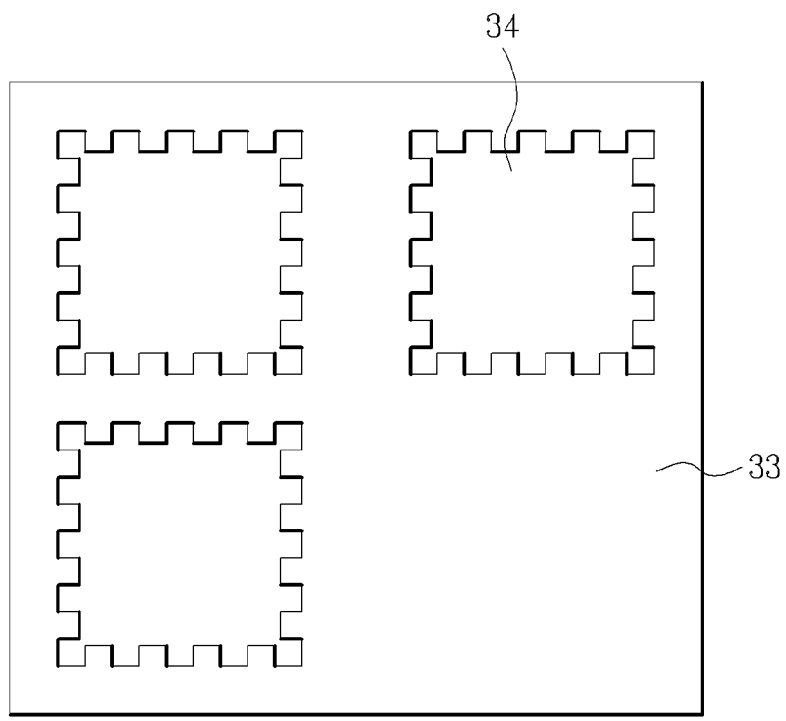
FIG. 3 is a layout of a color filter layer on an insulating interlayer in a CMOS image sensor according to the present invention.

FIG. 3 shows a color filter layer on an insulating interlayer in a CMOS image sensor according to the present invention. Here, a plurality of color filter layers 34 are formed on an insulating interlayer 33, uniformly spaced apart from each other. The spacing in one dimension (e.g., along a first axis in the plane of the page parallel with an edge of the color filter) may be independent of the spacing in another dimension (e.g., along a second axis in the plane of the page, perpendicular to the first axis). In this case, a boundary or edge of each of the color filter layers 34 is indented or "stepped." Also, the insulating interlayer 33 may further comprise a protective and/or planarizing layer at an upper surface thereof.

Figure 4:
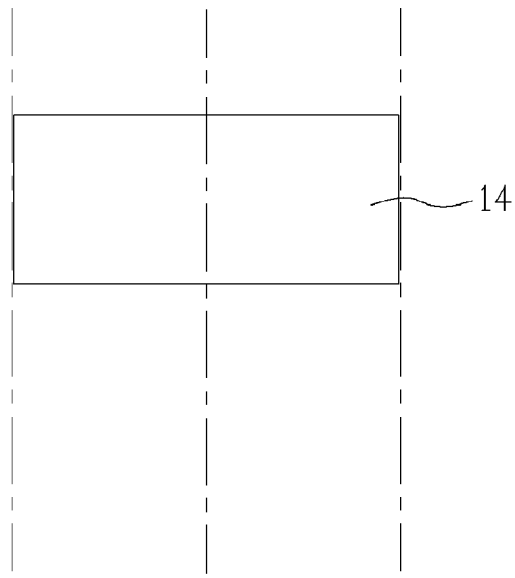
FIG. 4 is a diagram for the comparison of intensity profiles of ultraviolet radiation for exposure in color filter arrays (CFA) between the related art and the present invention.
Figure 4:
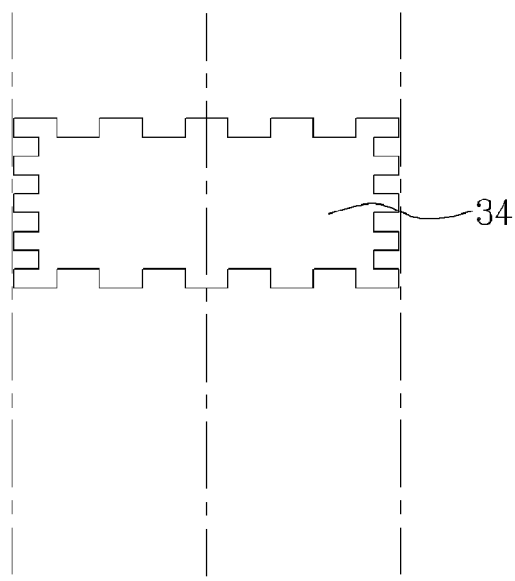

FIG. 4 compares intensity profiles of ultraviolet radiation for exposure in color filter arrays (CFA) between the related art and the present invention. Here, a plurality of indented portions are formed on a boundary of a color filter array 34 of the present invention, whereas a related art color filter array 14 has a rectangular shape.

In the related art method, in performing exposure to form a microlens pattern to correspond to the color filter array 14, a rectangular image is provided. After completion of development, the microlens pattern has the rectangular shape.

In performing exposure to form a microlens pattern corresponding to the color filter array 34 having the indented portions on its boundary, the boundary of the color filter array 34 may have a curved or spherical shape due to its UV intensity being lower than that of a central portion. Hence, after the plurality of indented portions have been formed on the boundary of the color filter array, if exposure and development are carried out to form the microlens pattern, a trapezoid pattern can be formed, as shown in FIG. 5B. Since resolution power at the boundary of the color filter array 34 having the indented portions is lowered in performing the exposure, the microlens pattern may have a uniform slope. Once reflowing is carried out on the trapezoid microlens pattern, a microlens having an improved or optimal curvature can be fabricated to enhance the light-condensing efficiency thereof.

FIGS. 5A-5E show a method of fabricating a CMOS image sensor according to the present invention.

Figure 5A:
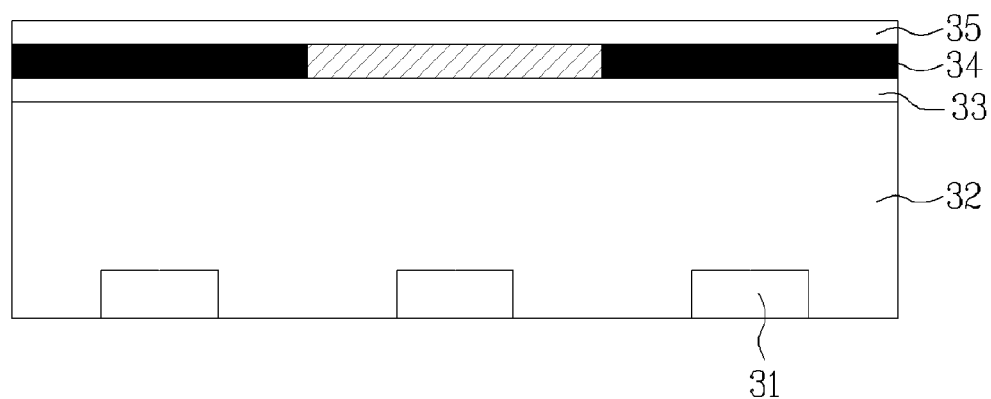
FIGS. 5A-5C are cross-sectional diagrams of a method of fabricating a CMOS image sensor according to the present invention.
Figure 5B:
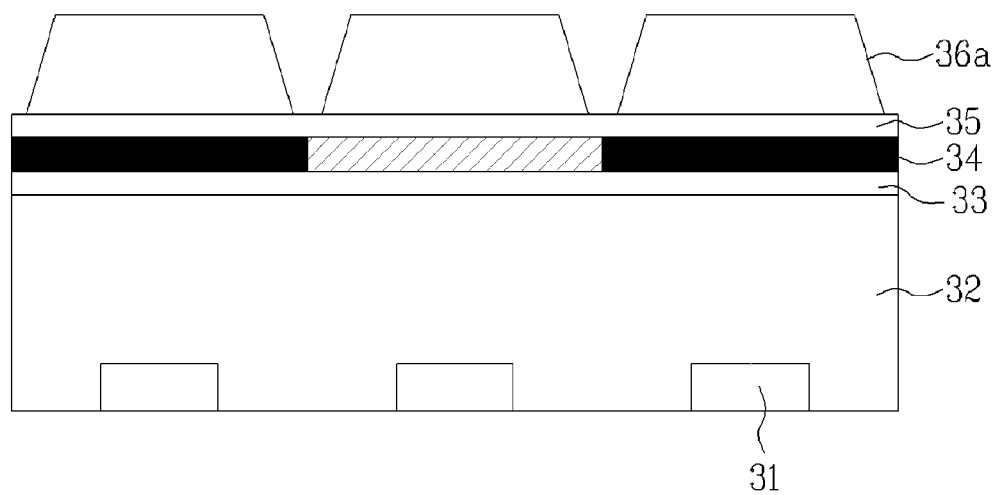

Referring to FIG. 5A, a plurality of photosensitive devices such as photodiodes 31 are formed on (or in) a semiconductor substrate (such as a single crystal silicon wafer, or an epitaxial silicon layer thereon). An insulating interlayer 32 is formed on the semiconductor substrate including the photodiodes 31. In this case, the insulating interlayer 32 can include a plurality of layers. For instance, a first insulating interlayer (not shown) may be formed over the semiconductor substrate, an optical shielding layer formed on the first insulating interlayer to prevent the incident light from entering an area except the corresponding photodiode 31, and a second insulating interlayer 32 formed on the optical shielding layer. Subsequently, a planarized protective layer 33 may be formed on the insulating interlayer 32 to protect a device from moisture and mechanical damage, such as scratches.

A dyeable resist is coated on the protective layer 33. Exposure and development are carried out on the dyeable resist to form a color filter for one color (e.g., red, green or blue) in color filter layer 34. The color filter-forming process is repeated for the remaining colors to form color filter layer 34, configured to filter light of different wavelengths, respectively in the different color filters. In doing so, a mask having a pattern enabling indented portions to be formed on a boundary of the color filters in layer 34 is used as a photomask (not shown) during an exposure step in forming the color filter layer 34.

Subsequently, a planarized top coating layer 35 is formed on the color filter layer 34, to secure a focus adjustment and a degree of planarization for subsequent formation of a lens layer.

Referring to FIG. 5B, a microlens material layer is coated on the top coating layer 35. The material layer is then patterned by exposure and development to form a microlens pattern 36a having a trapezoid shape. In doing so, a resist or an oxide layer such as TEOS can be used as the microlens material layer.

As mentioned in the foregoing description, after the plurality of indented portions have been formed on the boundary of the color filter array, if exposure and development are carried out to form the microlens pattern 36a, a trapezoid microlens pattern 36a (e.g., a microlens pattern having a plurality of pre-microlens bodies with trapezoidal cross-sections) may be formed. Since the resolution power on the boundary of the color filter array having the indented portions is considerably reduced when exposing the deposited microlens material layer to patterning radiation or light, the trapezoidal cross-section shapes in microlens pattern 36a may also have a uniform (or linear) slope.

In the embodiment of the present invention, the trapezoid microlens pattern 36a is generally formed after completion of the plurality of indented portions on the boundaries of the color filters in the color filter array. Yet, the microlens pattern 36a can be formed in various ways. For instance, after a microlens material layer (e.g., a resist) has been coated onto layer 35, a shape of the microlens pattern can be controlled by adjusting the intensity of UV radiation applied during the exposure by passing the UV radiation through a diffraction mask, and the like. In doing so, the diffraction mask may include an opening, a shielding part and a slit part.

Figure 5C:
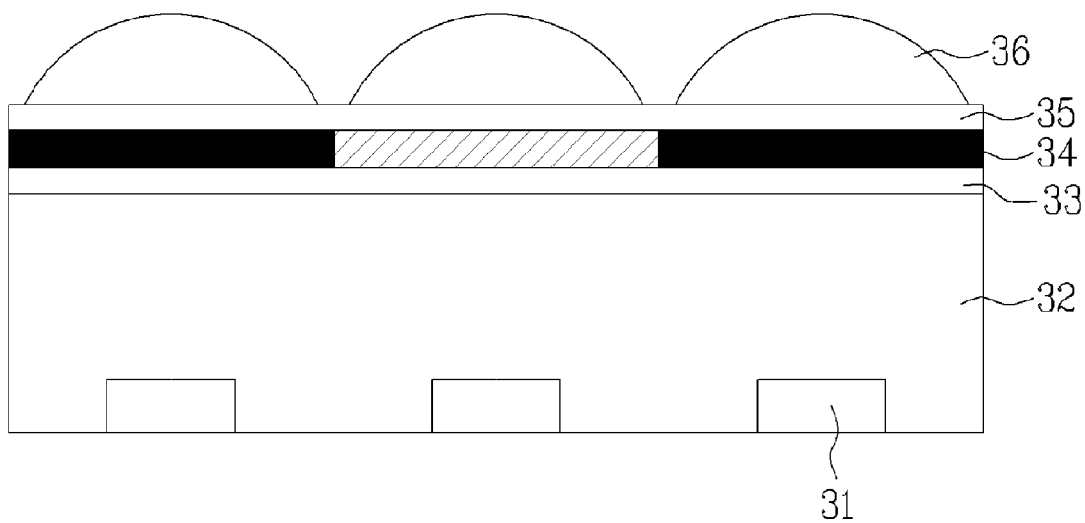

Referring to FIG. 5C, reflowing is carried out on the microlens pattern 36a to form a microlens 36. In doing so, the reflow operation can be carried out by placing the semiconductor substrate with the microlens pattern 36a thereon on a hot plate or in a furnace. In this case, a curvature of the microlens 36 may be varied or determined according to a contracting-heating method. A light condensing efficiency of the microlens 36 may depend on its curvature.

Subsequently, ultraviolet radiation is applied to the microlens 36 to harden it. In doing so, applying the ultraviolet radiation to the microlens 36 may enable the microlens 36 to maintain an optimal curvature radius.

Accordingly, the present invention provides the following effects or advantages.

First of all, the microlens is formed from a trapezoidal microlens pattern and reflowing the pattern. Hence, an improved or optimal curvature may be provided to enhance the light-condensing efficiency of the microlens.

Secondly, if the light-condensing efficiency is raised or increased, a quantity of the light passing through the color filter to enter the photodiode may be increased. Hence, the present invention can enhance the detection, sensitivity and/or implementation of colors.

Finally, if the detection, sensitivity and/or implementation of colors is enhanced, the performance of the CMOS image sensor may be improved or enhanced.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A CMOS image sensor, comprising:
    a plurality of photodiodes on or in a semiconductor substrate;
    an insulating layer on the semiconductor substrate including the photodiodes;
    a color filter layer on the insulating layer, the color filter layer comprising a plurality of color filters, each color filter comprising a plurality of indented portions on a plurality of boundaries thereof; and
    a plurality of microlenses on the color filter layer, each of the plurality of microlenses corresponding to a unique photodiode.

2. The CMOS image sensor of claim 1, further comprising a coating layer on the color filter layer, wherein the plurality of microlenses are on the coating layer.

3. The CMOS image sensor of claim 1, wherein the microlenses comprise a resist.

4. The CMOS image sensor of claim 1, wherein the insulating layer further comprises a protective layer on its upper surface.

5. The CMOS image sensor of claim 1, wherein the insulating layer further comprises a planarizing layer on its upper surface.

6. The CMOS image sensor of claim 1, wherein the insulating layer comprises a plurality of layers.

7. The CMOS image sensor of claim 1, wherein the insulating layer comprises an optical shielding layer.

8. The CMOS images sensor of claim 1, wherein the insulating layer comprises a first insulating layer, an optical shielding layer on the first insulating layer, and a second insulating layer on the optical shielding layer.

9. The CMOS image sensor of claim 1, wherein the plurality of indented portions forms a square wave pattern.

10. The CMOS image sensor of claim 1, wherein the plurality of indented portions forms a rectangle wave pattern.

11. The CMOS image sensor of claim 1, wherein the spacing of the color filters in one dimension is independent of the spacing in a perpendicular dimension.

12. The CMOS image sensor of claim 1, wherein the boundary of each color filter has a curved or spherical shape.

13. The CMOS image sensor of claim 1, wherein the microlenses have a curvature that enhances their light-condensing efficiency.

14. The CMOS image sensor of claim 1, wherein the microlenses comprise an oxide.

15. The CMOS image sensor of claim 2, wherein the insulating layer further comprises a protective layer on its upper surface.

16. The CMOS image sensor of claim 2, wherein the insulating layer comprises a plurality of layers.

17. The CMOS image sensor of claim 2, wherein the plurality of indented portions forms a square wave pattern.

18. The CMOS image sensor of claim 2, wherein the plurality of indented portions forms a rectangle wave pattern.

19. The CMOS image sensor of claim 2, wherein the microlenses comprise a resist.

* * * * *